United States Patent
Liu

(10) Patent No.: US 11,316,483 B2
(45) Date of Patent: Apr. 26, 2022

(54) INPUT VOLTAGE ENDURANCE PROTECTION ARCHITECTURE

(71) Applicant: 3PEAK INC., Suzhou (CN)

(72) Inventor: Qingfeng Liu, Suzhou (CN)

(73) Assignee: 3PEAK INC., Jiangsu (CN)

(*) Notice: Subject to any disclaimer, the term of this patent is extended or adjusted under 35 U.S.C. 154(b) by 37 days.

(21) Appl. No.: 17/042,381

(22) PCT Filed: Dec. 9, 2019

(86) PCT No.: PCT/CN2019/124020
§ 371 (c)(1),
(2) Date: Sep. 28, 2020

(87) PCT Pub. No.: WO2020/220682
PCT Pub. Date: Nov. 5, 2020

(65) Prior Publication Data
US 2022/0045651 A1    Feb. 10, 2022

(30) Foreign Application Priority Data

Apr. 30, 2019    (CN) .......................... 201910360268.9

(51) Int. Cl.
*H03F 1/52*    (2006.01)
*H03F 1/32*    (2006.01)
*H03F 3/45*    (2006.01)

(52) U.S. Cl.
CPC ........... *H03F 1/523* (2013.01); *H03F 1/3211* (2013.01); *H03F 3/45269* (2013.01); *H03F 2200/426* (2013.01)

(58) Field of Classification Search
CPC .... H03F 1/523; H03F 1/3211; H03F 3/45269; H03F 2200/426

(Continued)

(56) References Cited

U.S. PATENT DOCUMENTS 9,391,574 B2    7/2016    Huang et al.
2013/0329444 A1    12/2013    Oh

FOREIGN PATENT DOCUMENTS

CN    1499711    5/2004
CN    103036515    4/2013

(Continued)

OTHER PUBLICATIONS

International Search Report for PCT/CN2019/124020 dated Mar. 9, 2020.
Office Action in related CN201910360268.9 dated Feb. 25, 2021.

*Primary Examiner* — Hieu P Nguyen
(74) *Attorney, Agent, or Firm* — Woodard, Emhardt, Henry, Reeves & Wagner, LLP

(57) ABSTRACT

Provided is an input voltage endurance protection architecture applied to a high-voltage operational amplifier with high input amplitude and high linearity. The input voltage endurance protection architecture includes three parts: a main operational amplifier, an auxiliary operational amplifier and an input stage voltage endurance protection circuit. The main operational amplifier is a high-voltage general-purpose operational amplifier, the auxiliary operational amplifier is a single-stage differential amplifier, and the single-stage differential operational amplifier is connected to a degeneration resistor Rbias. In addition, the auxiliary operational amplifier has a same connection method as the main operational amplifier at a positive input terminal and a negative input terminal, and both the positive input terminal and the negative input terminal are protected by an input stage voltage endurance protection circuit and receive and process input signals simultaneously.

6 Claims, 3 Drawing Sheets

(58) Field of Classification Search
USPC .............................. 330/252–261, 298, 207 P
See application file for complete search history.

(56) References Cited

FOREIGN PATENT DOCUMENTS

| CN | 103956983 | 7/2014 |
|----|-----------|--------|
| CN | 105024658 | 11/2015 |
| CN | 107154786 | 9/2017 |
| CN | 107508567 | 12/2017 |
| CN | 107786172 | 3/2018 |
| CN | 108880488 | 11/2018 |
| CN | 110166009 | 8/2019 |

INPUT VOLTAGE ENDURANCE PROTECTION ARCHITECTURE

CROSS-REFERENCES TO RELATED APPLICATIONS

This application is a National Stage Application, filed under 35 U.S.C. 371, of International Patent Application No. PCT/CN2019/124020, filed on Dec. 9, 2019, which is based on and claims priority to Chinese patent application No. 201910360268.9 filed on Apr. 30, 2019, disclosure of which is incorporated herein by reference in its entirety.

TECHNICAL FIELD

The present application relates to a technology for improving input performance of an operational amplifier in a BCD process design, for example, to an input voltage endurance protection architecture applied to a high-voltage operational amplifier with high input amplitude and high linearity.

BACKGROUND

OPA is short for operational amplifier and named after a basic component of an analog computer. In addition to the characteristics of quite high gains and relatively high input impedance, a general-purpose operational amplifier manufactured by using an IC technology has the advantages of being exquisite, being low-cost and being flexible. In a practical circuit, the operational amplifier is usually combined with a feedback network to form a function module. Operational amplifiers are widely used in such aspects as active filters, switched-capacitor circuits, digital-to-analog converters and analog-to-digital converters, direct-current signal amplification, waveform generation and transformation, and signal processing.

FIG. 1 shows a common protection circuit of an input transistor pair of an operational amplifier in a high-voltage BCD process. The protection circuit includes two resistors and a clamping circuit. The effect of variations in an input common-mode voltage is determined by the performance of the main part of the operational amplifier. When an input differential-mode voltage is relatively small, the clamping circuit is switched off and the leakage current is rather small, and the operational amplifier can process an input signal properly. When an input differential-mode voltage exceeds the threshold voltage of the clamping circuit, the clamping circuit is switched on and a current flows through a resistor to form a voltage drop. The greater the voltage difference, the greater the input current and the greater the voltage drop, so the voltage difference between VIP and VIN is greatly limited.

FIG. 2 shows an existing patent of a protection circuit of a differential transistor pair in a high-voltage process. In FIG. 2, the resistor of FIG. 1 is replaced by an NMOS transistor. The gate voltage of the NMOS transistor of FIG. 2 is provided by a bias voltage Vbias, Vbias=min (VIN_IN, VIP_IN)+Vgs (M0_A/M0_B)+I*Rbias. That is, the gate voltage of the NMOS transistor is associated with the differential transistor pair (that serves as the main part of the operational amplifier). When an input common-mode voltage is relatively high, the bias voltage Vbias is also relatively high and the current source M1 of the operational amplifier enters a linear region prematurely. As a result, the performance of the operational amplifier is inevitably affected and the range of the common-mode voltage of an input signal is still limited.

SUMMARY

The present application provides an input voltage endurance protection architecture to expand an input voltage range, improve an operating state of a current source M1 of a main operational amplifier, and improve a signal processing capability of the operational amplifier.

The present application provides an input voltage endurance protection architecture, where the input voltage endurance protection architecture includes a main operational amplifier, an auxiliary operational amplifier and an input stage voltage endurance protection circuit connected to each other. The input stage of the main operational amplifier consists of a p-channel differential transistor pair with a p-channel tail current resource M1, and where a bias current of the main operational amplifier is provided by the current source M1.

The auxiliary operational amplifier is a single-stage differential operational amplifier, which consists of a p-channel differential transistor pair with $R_{load}$ to the ground and a p-channel tail current resource M2 connected in series with a degeneration resistor Rbias, and where a bias current of the auxiliary operational amplifier is provided by the current source M2.

The input stage voltage endurance protection circuit includes a clamping circuit and two N-channel metal oxide semiconductor (NMOS) transistors. Gates of the two NMOS transistors are connected to a bias voltage Vbias between the degeneration resistor Rbias and the current source M2. The clamping circuit is connected between sources of the two NMOS transistors. A drain of one of the two NMOS transistors is connected to an input signal VIP, and a source retransmission signal VIP_IN is connected to a gate of the PMOS transistor corresponding to a positive terminal of the main operational amplifier and a gate of the PMOS transistor corresponding to a positive terminal of the auxiliary operational amplifier. A drain of the other of the two NMOS transistors is connected to an input signal VIN, a source retransmission signal VIN_IN is connected to a gate of the PMOS transistor corresponding to a negative terminal of the main operational amplifier and a gate of the PMOS transistor corresponding to a negative terminal of the auxiliary operational amplifier.

The auxiliary operational amplifier is configured to be a single-stage differential amplifier, and drains of the two PMOS transistors are both connected to ground through loads.

The clamping circuit is composed of one or more diodes or transistors connected in series.

In condition that an input common mode voltage is low enough to satisfy that the current source M2 of the auxiliary operational amplifier operates in a saturation region, both the two NMOS transistors operate in a linear region, an input differential mode voltage is lower than an opening threshold of the clamping circuit, the clamping circuit is closed, and both the main operational amplifier and the auxiliary operational amplifier operate in an amplification region and process an input signal without distortion.

In condition that an input common mode voltage is low enough to satisfy that the current source M2 of the auxiliary operational amplifier operates in a saturation region and a differential mode voltage is increased to open the clamping circuit, Vgs of the two NMOS transistors in the input stage voltage endurance protection circuit vary with a smaller one of input signals VIN and VIP, where an NMOS transistor having a lower input voltage is turned on, and the input signals are transmitted to the main operational amplifier and the auxiliary operational amplifier, and an NMOS transistor having a higher input voltage is in a subthreshold region with a relatively large equivalent resistance, and the NMOS transistor having the higher input voltage limits an input current, and the input voltage is loaded by the NMOS transistor having the higher input voltage. In condition that an input common mode voltage is raised to satisfy that the current source M2 of the auxiliary operational amplifier exits a saturation region and enters a linear region, a drain voltage of the current source M1 of the main operational amplifier is lower than a drain voltage of the current source M2 by I*Rbias, the current source M1 of the main operational amplifier is in the saturation region, and the main operational amplifier can operate in an amplification region, receive and process an input signal.

The present application provides the input voltage endurance protection architecture applied to a high-voltage operational amplifier. An auxiliary differential operational amplifier and the connection between the source of the auxiliary differential operational amplifier and degeneration resistor are introduced such that a bias voltage of the NMOS in the input voltage endurance protection circuit is isolated from the main operational amplifier, thereby improving an operating state of the main operational amplifier, expanding the input voltage range, and enhancing the linearity of the main operational amplifier.

DETAILED DESCRIPTION

Embodiments of the present application will be described below in detail in combination with the drawings, such that the technical schemes of the present application are easier to be understood and mastered, and thus to define the protection scope of the present application more clearly.

The present application makes a comprehensive analysis of deficiencies in protection of input transistor pair of an operational amplifier in a high-voltage BCD process according to the related art, proposes an input voltage endurance protection structure applying to a high-voltage operational amplifier with high input amplitude and high linearity. In the present application, a technical solution of isolating a main operational amplifier is introduced, which is beneficial to improve an input voltage range and linearity.

Figure 3:
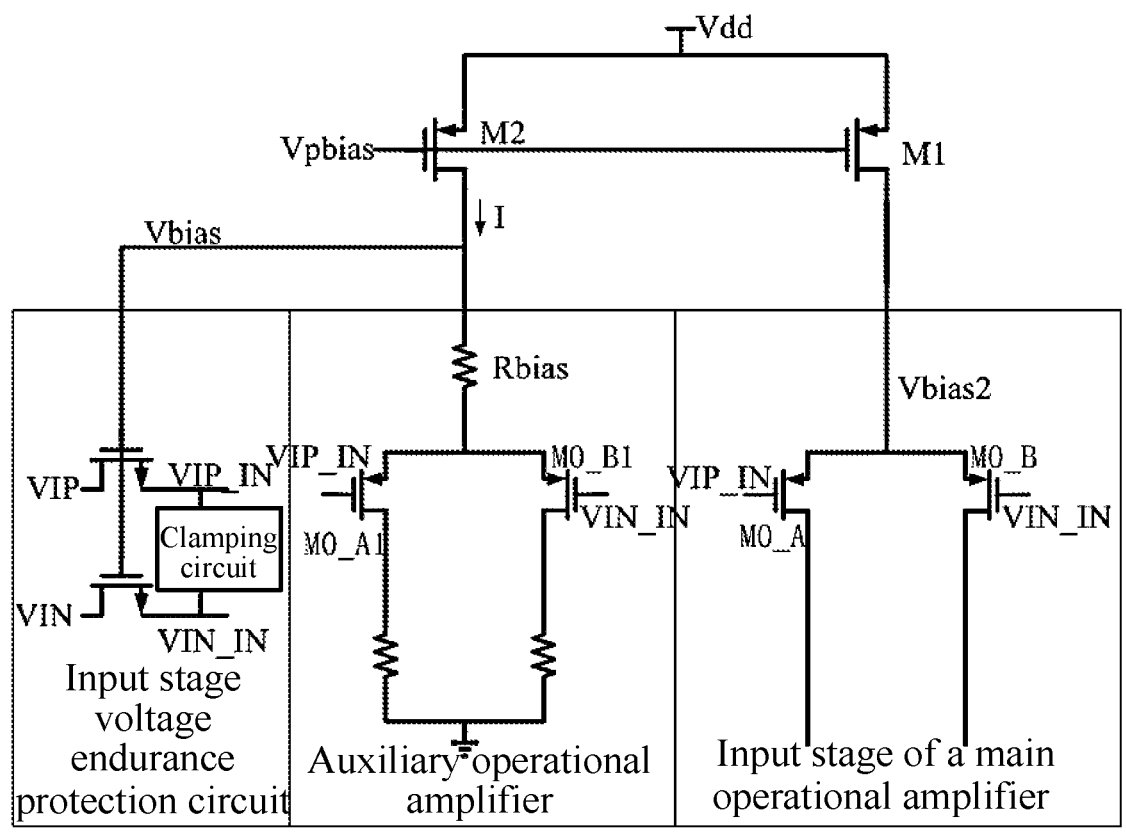
FIG. 3 is a circuit schematic diagram of an input voltage endurance protection architecture applied to a high-voltage operational amplifier of the present application.

For more concrete understanding, FIG. 3 shows a schematic diagram of an input voltage endurance protection architecture applied to a high-voltage operational amplifier with high input amplitude and high linearity. As an innovative design point of the present application, the input voltage endurance protection architecture includes three main parts, which are an input stage voltage endurance protection circuit, an auxiliary operational amplifier and a main operational amplifier. The main operational amplifier is a high-voltage general-purpose operational amplifier, and the auxiliary operational amplifier may be selected as a single-stage differential amplifier or a differential input transistor pair of a same type. The auxiliary operational amplifier has a same connection method as the main operational amplifier at a positive input terminal and a negative input terminal, and both the positive input terminal and the negative input terminal are protected by the input stage voltage endurance protection circuit, which can receive and process input signals simultaneously. The input stage voltage endurance protection circuit includes two NMOS transistors and a clamping circuit, each NMOS transistor can bear a higher voltage, and a gate voltage of the NMOS transistor is determined by the smaller of the input signal VIP and VIN, Vgs of an auxiliary operational amplifier input transistor and a voltage drop of a bias resistor Rbias.

Referring to FIG. 3, an input stage of the above-mentioned main operational amplifier is a pair of PMOS transistors M0_A and M0_B, and the pair of PMOS transistors are connected to the current source M1. An input stage of the above-mentioned auxiliary operational amplifier are the other pair of PMOS transistors M0_A1 and M0_B1, sources of the PMOS transistors M0_A1 and M0_B1 are connected in series with a degeneration resistor Rbias and the current source M2. Drains of the pair of PMOS transistors M0_A1 and M0_B1 are both connected to ground through loads. Gates of the PMOS transistor M0_A1 and the PMOS transistor M0_A are both connected to a retransmission signal VIP_IN of the input stage voltage endurance protection circuit, and gates of the PMOS transistor M0_B and the PMOS transistor M0_B1 are both connected to a retransmission signal VIN_IN of the input stage voltage endurance protection circuit. Both the current source M1 and the current source M2 are transistors, and sources of the current source M1 and the current source M2 are connected to a power supply voltage Vdd and gates of the current source M1 and the current source M2 are connected to a bias voltage Vpbias.

The above-mentioned input stage voltage endurance protection circuit includes the clamping circuit and two NMOS transistors. A common gate of the two NMOS transistors is connected to the bias voltage Vbias between the degeneration resistor Rbias and the current source M2. The clamping circuit is connected between sources of the two NMOS transistors. A drain of one of the two NMOS transistors is connected to an input signal VIP, and the source retransmission signal VIP_IN is connected to positive input terminals of the main operational amplifier and the auxiliary operational amplifier. A drain of the other NMOS transistor is connected to an input signal VIN, and the source retransmission signal VIN_IN is connected to negative input terminals of the main operational amplifier and the auxiliary operational amplifier. The clamping circuit is composed of one or more diodes or transistors connected in series.

In condition that both an input common mode voltage and a differential mode voltage is relatively small, that is, it satisfies a condition that Vgs of the NMOS transistors in the input voltage endurance protection circuit is relatively large, both the NMOS transistors operate in a linear region, an equivalent resistance is small, the clamping circuit is closed, both the main operational amplifier and the auxiliary operational amplifier operate in an amplification region within this input range, and the input signal can be processed without distortion.

In condition that the input common mode voltage is relatively small and the differential mode voltage is relatively large, that is, the input common mode voltage is low enough to satisfy that the current source M2 of the auxiliary operational amplifier operates in a saturation region and the differential mode voltage is increased to open the clamping circuit, gate voltages of the two NMOS transistors in the input stage voltage endurance protection circuit vary with the smaller one of input signals VIN and VIP, and both the main operational amplifier and the auxiliary operational amplifier operate in the amplification region. By contrast, the Vgs of an NMOS having a lower input voltage is larger, the NMOS is turned on, the equivalent resistance is small, and the signal can be transmitted to an input terminal of the operational amplifier. Due to a function of a leakage current and a clamping circuit, Vgs of an NMOS having a higher input voltage is smaller and the equivalent resistance is large, so that the input current is limited and a higher input voltage is beard. In this way, the differential input transistor pair of the operational amplifier can be well protected and a range of an input differential mode voltage is expanded, and generally an input differential voltage can reach the power supply voltage Vdd.

In condition that the input common mode voltage becomes larger and larger, a gate voltage of the NMOS transistor, that is, the bias voltage Vbias, will be increased, and Vds of the current source M2 of the auxiliary operational amplifier will be gradually decreased. In condition that the input common mode exceeds a certain threshold, the current source M2 exits the saturation region and enters the linear region. Due to influence of transistor channel modulation effect, a bias current I decreases synchronously, Vbias increases slowly, Vgs of the NMOS transistor gradually decreases, and the input equivalent resistance increases. Simultaneously, Vds of the current source M1 also gradually decreases but still operates in the saturation region, and the main operational amplifier can still effectively receive and process the input signal.

Figure 1:
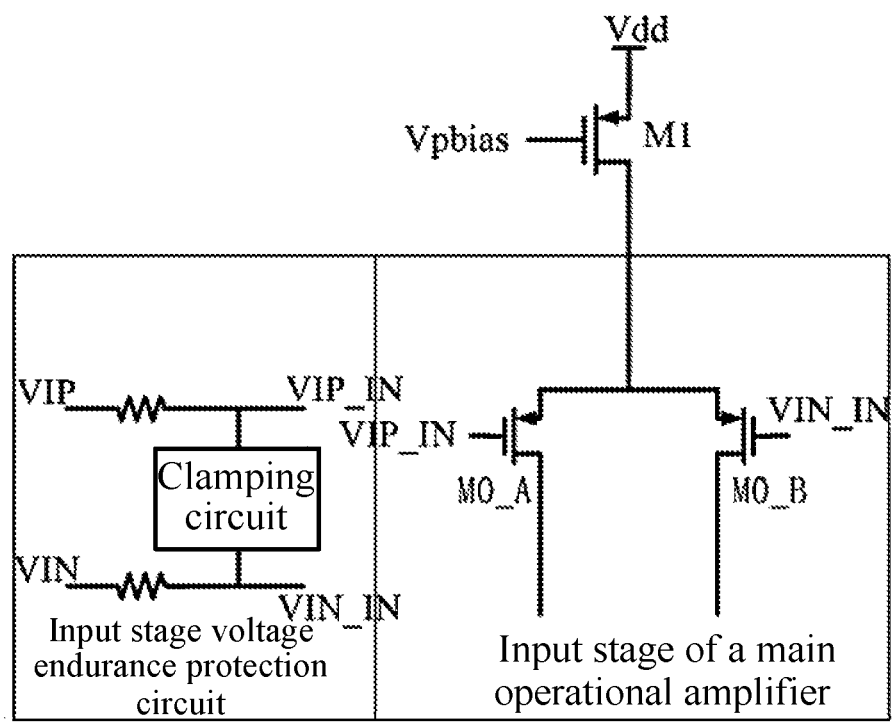
FIG. 1 is a schematic diagram of a protection circuit of commonly used input transistor pair in related high-voltage BCD process.
Figure 2:
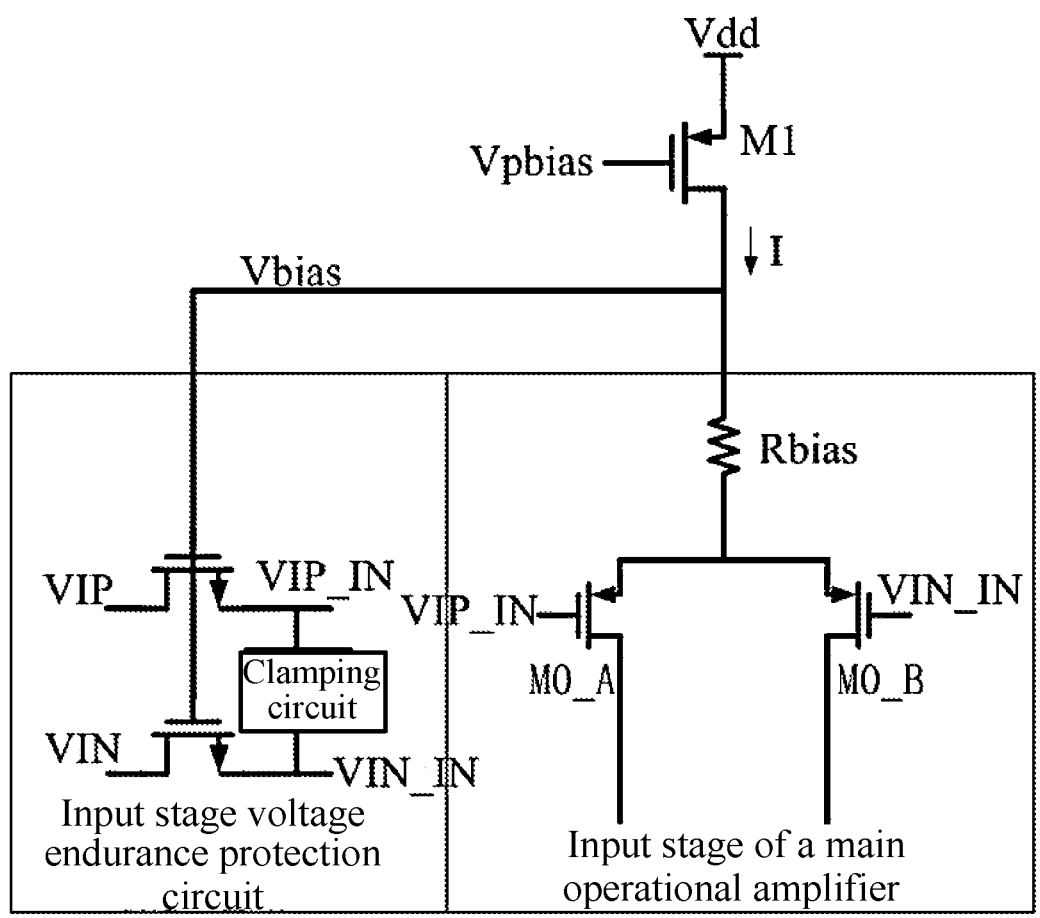
FIG. 2 is a schematic diagram of a protection circuit of differential transistor pair in a related improved high-voltage process.

Of course, if the input common mode voltage continues to increase I*Rbias, the current source M1 also starts to enter the linear region, and performance of the main operational amplifier will be affected. However, compared with a design scheme shown in FIG. 2, the high-voltage operational amplifier has a significantly improvement in amplitude of the input common mode voltage.

In summary, with the detailed description of the illustrated embodiments, a circuit structure design applied to the present application has outstanding substantive characteristics and remarkable progress. In the input voltage endurance protection architecture applied to the high-voltage operational amplifier, the single-stage auxiliary differential operational amplifier and the connection between the source and degeneration resistor are introduced such that the bias voltage of the NMOS in the input voltage endurance protection circuit is isolated with the main operational amplifier, therefore improving the operating state of the main operational amplifier, expanding the input voltage range, and enhancing the linearity of the main operational amplifier.

What is claimed is:

1. An input voltage endurance protection architecture, wherein the input voltage endurance protection architecture comprises a main operational amplifier, an auxiliary operational amplifier and an input stage voltage endurance protection circuit connected to each other, wherein an input stage of the main operational amplifier comprises a p-channel differential transistor pair with a p-channel tail current resource M1, and wherein a bias current of the main operational amplifier is provided by the current source M1;

wherein the auxiliary operational amplifier is a single-stage operational that comprises a p-channel transistor pair with $R_{load}$ to a ground and a p-channel tail current resource M2 connected in series with a degeneration resistor Rbias, and wherein a bias current of the auxiliary operational amplifier is provided by the current source M2; and wherein the input stage voltage endurance protection circuit comprises a clamping circuit and two N-channel metal oxide semiconductor (NMOS) transistors, wherein gates of the two NMOS transistors are connected to a bias voltage Vbias between the degeneration resistor Rbias and the current source M2, wherein the clamping circuit is connected to sources of the two NMOS transistors, and a drain of one of the two NMOS transistors is connected to an input signal VIP, a source retransmission signal VIP-IN is connected to a gate of a PMOS transistor corresponding to a positive terminal of the main operational amplifier and a gate of a PMOS transistor corresponding to a positive terminal of the auxiliary operational amplifier, and a drain of the other of the two NMOS transistors is connected to an input signal VIN, a source retransmission signal VIN_IN is connected to a gate of the PMOS transistor corresponding to a negative terminal of the main operational amplifier and a gate of the PMOS transistor corresponding to a negative terminal of the auxiliary operational amplifier.

2. The input voltage endurance protection architecture of claim 1, wherein the auxiliary operational amplifier is configured to be a single-stage differential amplifier, and drains of two PMOS transistors are both connected to ground through loads.

3. The input voltage endurance protection architecture of claim 1, wherein the clamping circuit is comprises one or more diodes or transistors connected in series.

4. The input voltage endurance protection architecture of claim 1, wherein in condition that an input common mode voltage is low enough to satisfy that the current source M2 of the auxiliary operational amplifier operates in a saturation region, both the two NMOS transistors operate in a linear region, an input differential mode signal is lower than an opening threshold of the clamping circuit, the clamping circuit is closed, and both the main operational amplifier and the auxiliary operational amplifier operate in an amplification region and process an input signal without distortion.

5. The input voltage endurance protection architecture of claim 1, wherein in condition that an input common mode voltage is low enough to satisfy that the current source M2 of the auxiliary operational amplifier operates in a saturation region and a differential mode voltage is increased to open the clamping circuit, gate-source voltages Vgs of the two NMOS transistors in the input stage voltage endurance protection circuit vary with a smaller one of input signals VIN and VIP, wherein an NMOS transistor having a lower input voltage is turned on, and the input signals are transmitted to the main operational amplifier and the auxiliary operational amplifier, and an NMOS transistor having a higher input voltage is in a subthreshold region with a relatively large equivalent resistance, and the NMOS transistor having the higher input voltage limits an input current and the input voltage is loaded by the NMOS transistor having the higher input voltage.

6. The input voltage endurance protection architecture of claim 1, wherein in condition that an input common mode voltage is raised to satisfy that the current source M2 of the auxiliary operational amplifier exits a saturation region and enters a linear region, a drain voltage of the current source M1 of the main operational amplifier is lower than a drain voltage of the current source M2 by I*Rbias, and the current source M1 of the main operational amplifier is in the saturation region, and the main operational amplifier operates in an amplification region and receives and processes an input signal.

* * * * *